(12) United States Patent
Reber

(10) Patent No.: US 7,838,437 B2
(45) Date of Patent: Nov. 23, 2010

(54) METHOD FOR SIMULTANEOUS RECRYSTALLIZATION AND DOPING OF SEMICONDUCTOR LAYERS

(75) Inventor: Stefan Reber, Gundelfingen (DE)

(73) Assignee: Fraunhofer-Gesellschaft zur Forderung der Angewandten Forschung e.V., Munich (DE)

( * ) Notice: Subject to any disclaimer, the term of this patent is extended or adjusted under 35 U.S.C. 154(b) by 561 days.

(21) Appl. No.: 11/662,856

(22) PCT Filed: Sep. 14, 2005

(86) PCT No.: PCT/EP2005/009898

§ 371 (c)(1),
(2), (4) Date: Jan. 18, 2008

(87) PCT Pub. No.: WO2006/029849

PCT Pub. Date: Mar. 23, 2006

(65) Prior Publication Data

US 2008/0311697 A1    Dec. 18, 2008

(30) Foreign Application Priority Data

Sep. 15, 2004    (DE) .................... 10 2004 044 709

(51) Int. Cl.
*H01L 21/31* (2006.01)
(52) U.S. Cl. .................. 438/766; 438/486; 438/488; 438/564; 438/764
(58) Field of Classification Search ......... 438/197–198, 438/299, 301–306, 530–533, 655, 96–97, 438/166, 365, 417, 491, 486–488, 564, 766
See application file for complete search history.

(56) References Cited

U.S. PATENT DOCUMENTS

| 4,046,618 A | 9/1977 | Chaudhari et al. | .......... 156/603 |
| 4,659,422 A | 4/1987 | Sakurai | .................. 156/617 R |
| 4,707,217 A | 11/1987 | Aklufi | ..................... 156/617 R |
| 5,192,991 A | 3/1993 | Hosokawa | .................... 257/51 |

(Continued)

OTHER PUBLICATIONS

Arimoto, S., Morikawa, H., Deguchi, M., Kawama, Y., Matsuno, Y., Ishihara, T., Kumabe, H., Murotani, T., High-efficient Operation of Large-Area (100cm$^2$) Thin Film Polycrystalline Silicon Solar Cell Based on SOI Structure, Solar Energy Materials and Solar Cells, pp. 257-262.

(Continued)

Primary Examiner—Dung A. Le
(74) Attorney, Agent, or Firm—Brinks Hofer Gilson & Lione

(57) ABSTRACT

The invention relates to a method for simultaneous recrystallization and doping of semiconductor layers, in particular for the production of crystalline silicon thin layer solar cells. In this method, in a first step a substrate base layer 1 is produced, in a step subsequent thereto, on the latter an intermediate layer system 2 which has at least one doped partial layer is deposited, in a step subsequent thereto, an absorber layer 3 which is undoped or likewise doped is deposited on the intermediate layer system 2, and in a recrystallization step, the absorber layer 3 is heated, melted, cooled and tempered. In an advantageous method modification, instead of an undoped capping layer, a capping layer system 4 which has at least one partial layer can also be applied on the absorber layer 3.

36 Claims, 2 Drawing Sheets

U.S. PATENT DOCUMENTS

| | | | |
|---|---|---|---|
| 5,238,879 | A | 8/1993 | Plaettner ..................... 437/233 |
| 5,810,945 | A | 9/1998 | Stutzmann et al. .......... 136/258 |
| 6,777,317 | B2 * | 8/2004 | Seibel et al. ................. 438/486 |
| 2001/0012677 | A1 | 8/2001 | Sameshima ................. 438/458 |
| 2004/0110335 | A1 * | 6/2004 | Jyumonji .................... 438/202 |

OTHER PUBLICATIONS

Bau, S., Janz, S., Kieliba, T., Schetter, C., Reber, S., Lutz, F., Application of PECVD-SIC As Intermediate Layer in Crystalline Silicon Thin-Film Solar Cells, Fraunhofer Institute for Solar Energy Systems ISE, Freiburg, Germany.

Ishihara, T., Arimoto, S., Kumabe, H., Murotani, T., Zone-melting Recrystallization of Silicon Thin Films for Solar Cell Application, Progress in Photovoltaics: Research and Applications, Mar./Apr. 1995, pp. 105-113, No. 2, Chichester, GB.

Kieliba, T., Reber, S., Enhanced Zone-Melting Recrystallization for Crystalline Silicon Thin-Film Solar Cells, 16$^{th}$ European Photovoltaic Solar Energy Conference, Glasglow, May 1-5, 2000.

Mauk, Michael G., Balliet, Jeremy R., Feyock, Bryan W., Large-grain (>1-mm), Recrystallized Germanium Films On Alumina, Fused Silica, Oxide-Coated Silicon Substrates for III-V Solar Cell Applications, Journal of Crystal Growth, 250 (2003), pp. 50-56.

Nijs, J., Sivoththaman, S., Szlufcik, J., De Clercq, K., Duerinckx, F., Van Kerschaever, E., Einhaus, R., Poortmans, J., Vermeulen, Tom, Mertens, R., Overview of Solar Cell Technologies and Results on High Efficiency Multicrystalline Silicon Substrates, Solar Energy Materials and Solar Cells 48 (1997) pp. 199-217.

Rath, J.K., Low Temperature Polycrystalline Silicon: A Review on Deposition, Physical Properties and Solar Cell Applications, Solar Energy Materials and Solar Cells 76 (2003) pp. 431-487.

* cited by examiner

METHOD FOR SIMULTANEOUS RECRYSTALLIZATION AND DOPING OF SEMICONDUCTOR LAYERS

BACKGROUND

The present invention relates to a method for simultaneous recrystallisation and doping of semiconductor layers, in particular for the production of crystalline silicon thin layer solar cells and semiconductor layer systems produced according to this method, in particular crystalline silicon thin layer solar cells.

The production of thin, doped semiconductor layers or layer systems for electronics and photovoltaics is implemented at present in the most varied of ways. In general, the aim is to produce sandwich-like layer structures comprising differently doped partial layers. Typically, a plurality of process steps is thereby used, with which such a layer structure is constructed sequentially. The construction takes place either by growing partial layers (deposition, epitaxy) or by introducing a dopant (for example by diffusion or implantation). The methods are typically characterised in that a plurality of implanting processes or deposition processes is required in order to produce a plurality of differently doped layers. The exceptions are so-called co-diffusion processes in which differently doped layers are produced simultaneously from different dopant sources.

The present invention relates to semiconductor layer structures in which the semiconductor is recrystallised after a deposition step again via the liquid phase in order for example to change the crystal structure. Such an application is provided for example in "Silicon on Insulator" (SOI) technology or in the field of crystalline silicon thin layer solar cells. The invention is explained subsequently by way of example in particular with reference to the latter system.

Crystalline silicon thin layer solar cells are produced at present by different methods. One of these methods from prior art comprises the following process steps:

1. Production of a substrate.
2. Deposition of a conductive intermediate layer.
3. Deposition of a seed layer which is normally enriched with dopant which causes an n or p conductivity in the seed layer.
4. Application of a "capping" layer by deposition or thermal oxidation.
5. Heating and recrystallisation of the seed layer.
6. Removal of the capping layer.
7. Deposition of the photovoltaically active absorber layer.
8. Production of the pn transition by introducing a dopant into the active absorber layer.
9. Application of the metallisation.

The seed layer thereby serves both for the purpose of forming crystallisation seeds for the epitaxial deposition of the absorber and for forming a so-called "back surface field" (BSF) in order to reduce charge carrier recombinations. The seed layer is normally highly doped for this purpose.

Starting from the state of the art, it is the object of the present invention to make the separate deposition of the photovoltaically active absorber layer superfluous without requiring to cut back on the functionality of the basic construction, in particular the presence of the BSF layer.

SUMMARY

This object is achieved by the production method according to patent claim 1, the semiconductor system produced accordingly according to patent claim 38 and also the system according to claim 39. Advantageous developments of the method according to the invention are described in the respective dependent patent claims.

The following process steps are modified in the method according to the invention:

Process step 2: instead of an undoped intermediate layer, a layer system comprising at least one partial layer is deposited. At least one of the partial layers of the layer system has a proportion of dopant which can act in the active absorber layer as acceptor or donor.

Process step 3: the level of doping of the layer deposited in the third process step is chosen to be lower than or equal to the doping which is necessary for the absorber of the finally produced semiconductor system or of the finally produced thin layer solar cell.

As a result of these two process step modifications, process step 7 (i.e. separate deposition of the absorber layer) can be dispensed with because, as a result of the subsequently described processes, in the recrystallisation step (step 5), the layer deposited in process step 3 can be used as absorber. The essence of the method according to the invention resides ultimately in the fact that both the formation of a BSF layer and the doping of the active absorber layer can be effected during the recrystallisation step. The recrystallisation step and the doping step are effected simultaneously. The formation of the BSF layer directly follows the simultaneously occurring recrystallisation and doping, so that the formation of the BSF layer, the recrystallisation and the doping of the absorber layer take place in situ in a high temperature step.

In an advantageous embodiment variant, process step 4 is also modified. Instead of an undoped capping layer, a layer system comprising at least one partial layer is deposited. At least one of these partial layers of the deposited capping layer system has a proportion of dopant which is complementary to that of the absorber layer. This embodiment effects the production of a pn transition simultaneously with the production of the BSF layer directly after the resolidification in the same high temperature step. After removal of the capping multilayer, the metallisation of the solar cell can then be begun immediately.

In addition, as a result of further recrystallisation of the emitter/absorber layer on the surface orientated away from the substrate base, an emitter layer of any thickness which falls below the absorber thickness can be produced with specific adjustment of the thickness of the liquefied silicon.

In a further advantageous embodiment variant, the doped partial layer of the intermediate layer system and the doped partial layer of the capping layer system are doped complementarily to the doping of the layer deposited in process step 3 (later absorber). In this case, a pnp or an npn doped system is produced. The intermediate layer system can also be doped complementarily to the capping layer system and to the layer deposited in process step 3 (later absorber layer). This then leads to npp$^+$ or pnn$^+$ doped systems. Further permutations are also possible (p$^+$pn or n$^+$np systems).

The advantages of the method according to the invention reside in the simplified process sequence which makes it possible in particular to produce economically crystalline silicon thin layer solar cells: the layer structure and the functionality of the layer system can be achieved with fewer process steps.

The method according to the invention for the production of doped semiconductor layer systems or semiconductor layer systems produced according to this method can be produced or configured as in the subsequently described example. The example describes a crystalline silicon thin layer solar cell which does not however lead to a restriction in the protective scope as given by the patent claims.

DESCRIPTION OF PREFERRED EMBODIMENTS

Figure 1A:
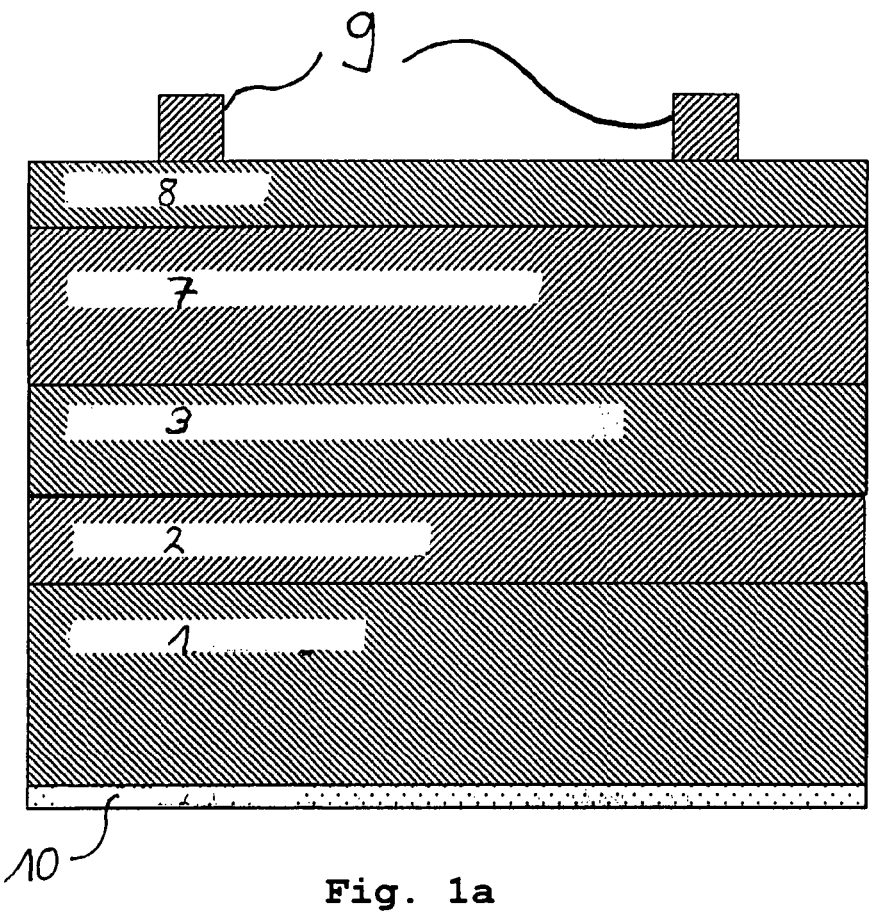
FIG. 1 outlines the production of a crystalline silicon thin layer solar cell by a method according to the present state of the art.

FIG. 1a shows a substrate 1 on which a conductive SiC layer 2 is disposed as intermediate layer. On the side orientated away from the intermediate layer, a metallic base contact 10 is applied on the substrate underside. A seed layer 3 made of silicon is disposed on the intermediate layer 2. This seed layer 3 occurs in recrystallised, highly doped form (for solar cells normally >$10^{18}$ at/cm$^3$ dopant). On the highly doped seed layer 3, a normally doped (normally $10^{16}$-$10^{17}$ atoms/cm$^3$) silicon absorber layer 7 is disposed.

With reference to the substrate 1, viewed above the absorber layer 7, there is the emitter layer 8 on which two metallic emitter contacts 9 are disposed.

Figure 1B:
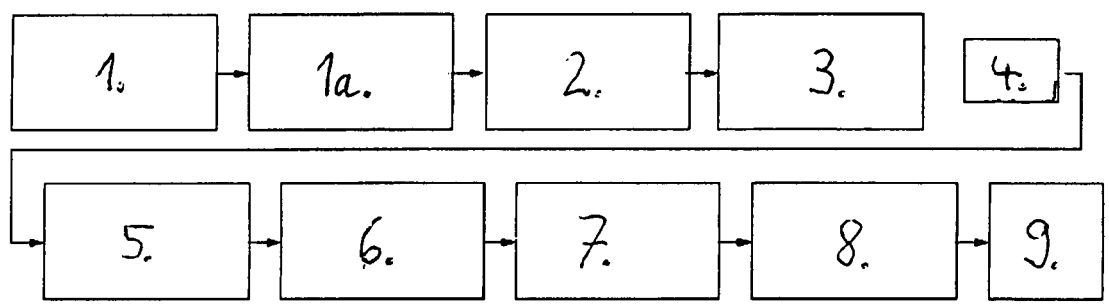

FIG. 1b shows the process sequence which leads to the production of a layer system of the recrystallised crystalline silicon thin layer solar cell according to FIG. 1a. In step 1, the substrate is produced by band pulling (ceramic/Si band). In step 1a, the cleaning of the substrate is subsequently effected. In the next step 2, deposition of the doped or undoped, conductive intermediate layer is effected. In process step 3, the seed layer made of silicon is deposited on the doped or undoped intermediate layer 2. Said seed layer is enriched with dopant which, in the present case, is suitable for producing an n conductivity in the seed layer. The dopant can however also produce a p conductivity. In process step 4, a capping layer is deposited. This comprises SiO$_2$ in the present case. The application of the capping layer can also be effected by thermal oxidation. In process step 5, the recrystallisation step, the silicon layer 3 or the seed layer 3 is heated and recrystallised by melting recrystallisation (in the present case zone melting recrystallisation). The recrystallisation step 5 comprises three partial processes: firstly the melting process in which the silicon of the seed layer 3 is present in liquid phase, secondly the solidification process in which the liquid silicon normally solidifies directionally and thirdly a tempering process (in which the silicon is kept at a temperature close to but below the melting temperature in order to dissipate frozen-in stresses) after the melting and solidification process in which the silicon is present as a solid.

In the subsequent step 6, the capping layer 4 is removed again. Thereafter, in process step 7, the deposition of the photovoltaically active silicon absorber layer 7 is effected. In the subsequent step 8, the pn transition is produced. This is effected in the present case by printing, spraying or depositing of a source layer which is enriched with dopant (this dopant is complementary to the dopant present in the absorber layer 7, i.e. leads in the present case to a p conductivity but can also, in the case of a p conductivity in the absorber layer 7, lead to an n conductivity) with subsequent or simultaneous introduction of the dopant into the active absorber layer 7 by tempering. As a result, the emitter layer 8 is produced. In step 9, finally the application of the metallisation or of the emitter contacts 9 and of the base contact 10 is effected. The silicon seed layer 3 serves two purposes: by means of said layer, crystallisation seeds are formed for the epitaxial deposition of the silicon absorber 7 and said layer serves for formation of a so-called "back surface field" (BSF) layer for reducing the charge carrier recombination at the interface of the intermediate layer 2 to the silicon. For this purpose, the seed layer 3 is highly doped in the present case.

Figure 2A:
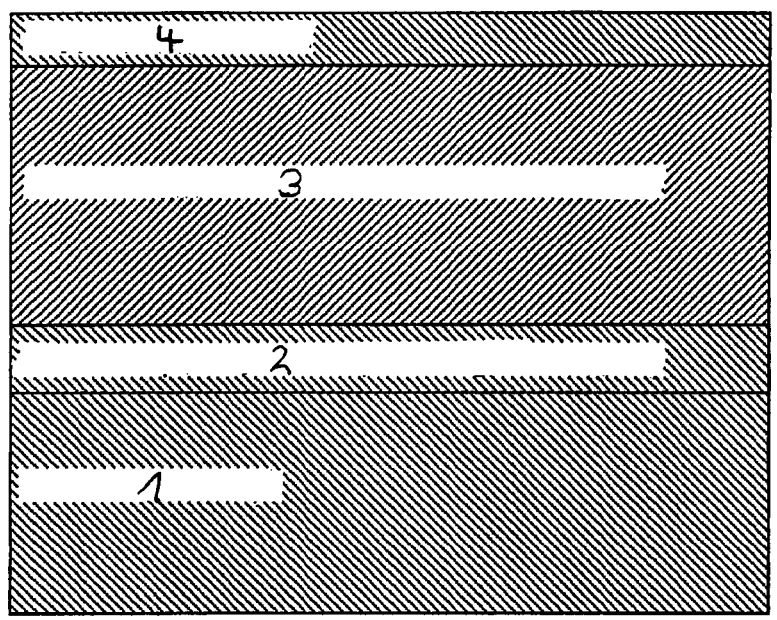
FIG. 2 outlines the production of crystalline silicon thin layer solar cells by the method according to the invention.
Figure 2B:
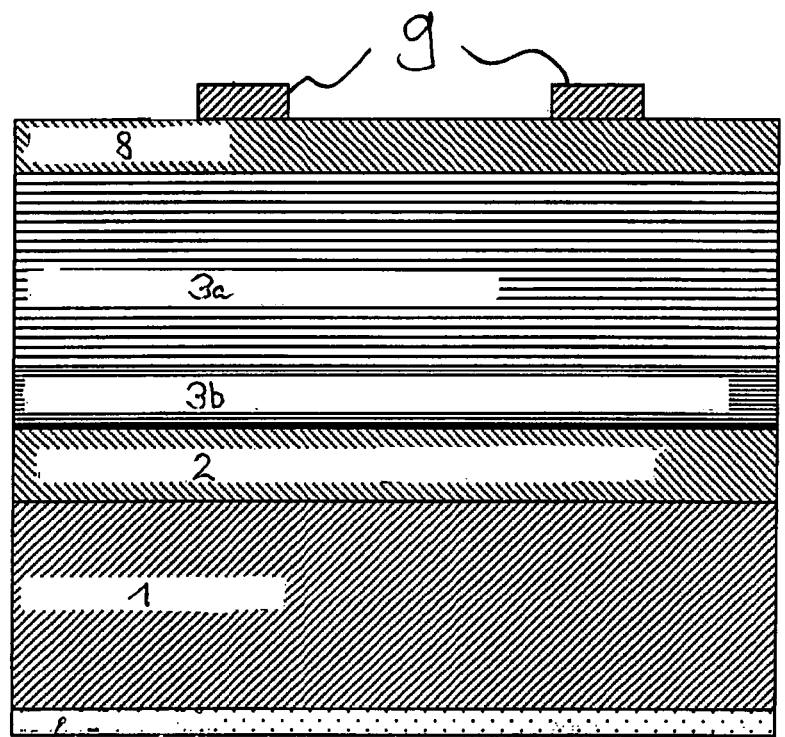

FIGS. 2a (before the melting process) and 2b (after the melting process and the metallisation) show how, in the method according to the invention in contrast to the method according to the state of the art (FIG. 1), the process step of silicon epitaxy (separate deposition of the active silicon absorber layer in process step 7) becomes superfluous without requiring to cut back on the functionality of the basic construction, in particular the presence of a BSF layer. In the Figures, layer or layer system components which correspond to the layers or layer system components in FIG. 1a or correspond to layer system components of the arrangement shown in FIG. 1a are characterised with identical reference numbers. In the process according to the invention, in process step 2, instead of an arbitrarily doped or undoped intermediate layer, an intermediate layer system comprising at least one partial layer is deposited (the latter is subsequently likewise characterised by the reference number 2). At least one of the partial layers of this intermediate layer system 2 has an exactly prescribed proportion of dopant which acts later as acceptor or donor in the active absorber layer to be deposited. In process step 3, the level of the silicon layer deposited in this process step (which represents the later absorber layer) is lower than or equal to the doping which is required for the later absorber layer or for the solar cell absorber. As a result of the subsequently described processes occurring in the recrystallisation step, the separate deposition of the silicon absorber (corresponding to the process step 7 in the state of the art) can be dispensed with in the method according to the invention. FIG. 2a now shows a diagram of the semiconductor layer combination according to the invention before the recrystallisation step 5. The conductive multi-intermediate layer 2 or the corresponding intermediate layer system 2 has been disposed or deposited on the conductive silicon substrate 1. This intermediate layer system 2 is electrically conductive but can inter alia be non-conductive (e.g. doped SiO$_2$) and highly doped (in the present case the doping leads to an n conductivity but can also lead to a p conductivity) and comprises a partial layer in the present case. On the intermediate layer system 2, the (later) silicon absorber layer 3 is deposited on the side orientated away from the substrate. Said absorber layer 3 in the present case has a doping (here: like the multi-intermediate layer 2 n doping but it can also be p doping if the intermediate layer system 2 has such), which is lower than the doping which arises ultimately for the solar cell absorber. The later absorber layer 3 can however also be undoped (a slight complementary doping to the intermediate layer is technically possible here also and is over-doped during recrystallisation). In FIG. 2b, two portions of the absorber layer (portion 3b on the side orientated away from the substrate directly adjacent to the intermediate layer system and portion 3a on the side of the portion 3b which is orientated away from the intermediate layer system 2 and directly adjacent to portion 3b) are characterised. In portion 3b, the highly doped BSF layer has formed by diffusion inwards after the recrystallisation process. The capping layer 4 is deposited or disposed above the later absorber layer 3 (FIG. 2a). In the present case, this is a capping multilayer or a capping layer system (which is described later).

The special features of the intermediate layer system are as follows (these special features apply also to the subsequently described capping layer system):

The dopant concentrations in the dopant source layers of the intermediate system 2 are normally approx. $10^{18}$ to $10^{22}$ atoms/cm$^3$. Buffer layers of the layer system 2 can be undoped or can have dopant concentrations up to approx. $10^{18}$ atoms/cm$^3$. These values apply before melting or the recrystallisation step. After melting or the recrystallisation step, the values for the dopant source layer (this corresponds to the previously mentioned partial layer with the exactly prescribed proportion of dopant) are typically $>10^{16}$ atoms/cm$^3$. The dopant distribution can have abrupt jumps but can also vary corresponding to the process slowly across the layer cross-section (perpendicularly to the layer plane). The number of layers used in the intermediate layer system 2 (source layers and buffer layers) is based on the requirements of the recrystallisation process. Normally it is two to three layers. As a rule, only one layer is hereby deposited as source layer. The layer thicknesses must be adjusted corresponding to the thermal course of the process. Normally layer thicknesses of the order of magnitude of 100 to 1000 nm are used. As layer materials, all materials are possible which retain semiconductor purity at the high process temperatures (up to approx. 1500° C.). Thus compounds comprising Si, O, C, N, B, P, Al, Ga, Sb, As and/or In are used, in particular $SiO_2$, $SiN_x$ (x is a whole number equal to or greater than 1), SiC, BN and/or BC.

As already described the doping of the intermediate layer system 2 can possibly be also complementary to the doping of the absorber layer 3.

If the BSF layer is used for thin layer solar cells, which layer is introduced into the rear side or into the side of the later absorber layer orientated towards the substrate (introduction can however also be effected alternatively hereto on the front side or on the side of the later absorber layer orientated away from the substrate), the following values are normally used for Si solar cells:

layer thickness of the BSF layer (given by the diffusion profile) in the range of 0.1 to 5 µm dopant concentration in the BSF layer in the range of approx. $10^{17}$ to $10^{21}$ atoms/cm$^3$ According to the material and application, these values can however also be outside the mentioned range.

In process step 5, the recrystallisation process, the following takes place: during the melting partial process, dopant is dissolved out of the intermediate layer system 2 and distributed quasi homogeneously in the melt of the later absorber layer 3. Upon resolidification of the melt of the later absorber layer 3, this dopant is incorporated into the resulting absorber layer and activated. It now serves for basic doping of this layer which consequently becomes the active absorber layer (or the basis of the solar cell). In the subsequent tempering and cooling process, further dopant diffuses out of the intermediate layer system 2 into the reformed absorber layer 3. Because of the reduced diffusion speed in the solid state of the absorber layer 3 relative to the liquid phase, the dopant now accumulates on the rear surface (i.e. on the surface of the absorber layer 3 orientated towards the intermediate layer system 2) of the absorber layer 3 and consequently forms in the layer region 3b a highly doped BSF layer as a result of the inward diffusion.

For control in the recrystallisation phase or in the recrystallisation step, the following parameters are available:

Heating capacities, distribution of the heating capacity, feed rate, heating/cooling ramps, level (i.e. temperature) of the tempering plateaux and tempering times. All these parameters ultimately influence a) the time in which the silicon is melted and b) the temperature course over time. The recrystallisation process, according to the invention can be described more precisely by 5 different phases:

1. Heating and retention phase (ramp for temperature increase):
    This typically lasts a few minutes, the final temperature for silicon is typically in the range of 900° C. to 1300° C. (in the case of other materials, the temperature must be correspondingly adapted). The control parameters during this phase are time, temperature course, plateau temperature, plateau time and/or the process gas atmosphere.
2. Melting phase:
    The melting of the silicon layer is effected here and the retention. During the zone melting process, distribution of the heating capacity, feed rate and in part also process gas atmosphere are determined by heating capacities. In the case of other melting methods, the parameters can be or be chosen to be different. Typical time durations: a few tenths to a few tens of seconds. During laser or electron beam recrystallisation, the time is significantly shorter (down to nanoseconds).
3. Recrystallisation phase: resolidification of the molten layer
    During the ZMR process (zone melting recrystallisation process), feed rate, heating capacity and heating capacity distribution, energy dissipation (heat conduction, radiation and convection) and also direction of the energy coupling determine the recrystallisation. This is important for the segregation which takes place during the resolidification (described subsequently).
4. Tempering phase:
    Control is possible in this phase only by adjusting temperature and tempering times, i.e. by the temperature profile over time. Here the doping is introduced and relaxation of strains in the crystal is effected. The control parameters in this phase are the temperature(s), the retention duration(s) and/or the cooling speed(s) (ramps).
5. Cooling phase:
    Cooling down of the substrate system to room temperature is effected here. The parameters for control here are the ramp duration and the ramp form. In particular the melting phase and the recrystallisation phase must be configured in the interaction of diffusion, solubility and segregation such that the desired end profile is produced.

The essence of the invention hence resides in the fact that the doping of the active absorber layer 3a and also the recrystallisation of the absorber layer 3a are effected simultaneously in a high temperature step and in that, in the same high temperature step (at the end of phase 3 and during phase 4), the production of the BSF layer 3b is effected immediately subsequently. Following the previously described process steps, the diffusion of the emitter is effected, the removal of the capping layer system 4 and also the application of the metallisation or of the emitter contacts 9.

FIG. 2b shows a crystalline silicon thin layer solar cell produced as described with the method according to the invention. On the conductive silicon substrate 1 (with the base contact 10 applied on the underside), the conductive, highly doped intermediate layer system 2 is disposed on the surface situated opposite the base contact. Above or on the side of the intermediate layer system 2 which is orientated away from the substrate, the inwardly diffused, highly doped BSF layer 3b is disposed adjacent to said intermediate layer system. Above or on the side of the BSF layer orientated away from the intermediate layer is then situated, adjacent to the latter, the normally doped silicon absorber layer, the actual absorber of the solar cell (reference number 3a). At the upper end of the layer sequence, directly on the absorber layer 3a (on the side thereof orientated away from the BSF layer thereof), the emitter layer 8 can be detected. On the latter, the two emitter contacts 9 are then disposed on the surface thereof orientated away from the absorber.

An advantageous extension of the modifications undertaken in comparison to the state of the art can also be detected with reference to FIG. 2a. Instead of an undoped capping layer, a capping layer system 4 comprising at least one partial layer is deposited on the later absorber layer 3. At least one partial layer of this capping layer system (in the illustrated case the capping layer system 4 comprises this partial layer) has a proportion of dopant which is complementary to that of the absorber layer (which therefore causes n conductivity if the absorber layer is p conducting and vice versa). In the present case, the doping effects a p conductivity. This capping layer system 4 now acts in the following manner during process step 5: in the partial melting process, dopant dissolves out of the capping layer system 4 and is distributed in the melt of the later absorber layer 3 quasi homogeneously. The quantity of dopant which dissolves out or diffuses inwards into this melt can be controlled by undoped or weakly doped partial layers which are situated on the side of the later silicon absorber layer 3 of the capping layer system 4. In the solidification partial process of process step 5, the concentration of dopant from the capping layer system 4 is adjusted in the later absorber layer 3 by segregation processes.

Segregation (this is a process in which a concentration difference arises between two adjacent layers even if thermal equilibrium is present. Segregation occurs to an extreme degree during solidification, e.g. for the contaminant iron in silicon: the concentration in the solid silicon can be $10^5$ times less than in the liquid state) between liquid and solid phase can be controlled by adjusting the temperature gradient in the layer and hence the direction of the solidification. Segregation occurs if two different materials abut against each other (for example $SiO_2$ and Si). This is then termed solid state segregation and can lead to the fact that a concentration gradient is maintained across two solid layers in thermal equilibrium. In the method according to the invention, the solid state segregation can be exploited by skillfully chosen layer materials for the intermediate layer system 2 and/or the capping layer system 4 on the interface to the silicon or to the absorber layer 3.

In the tempering step, further dopant diffuses from the capping multilayer 4 into the now solid absorber layer 3. Because of this solid state diffusion, a layer which is counter-doped relative to the absorber layer 3 and serves as solar cell emitter or emitter layer 8 (see FIG. 2b) is formed on the surface of the silicon layer.

The concentration of the third dopant in the absorber layer (the third dopant is the one which diffuses out of the doped partial layer of the capping layer system 4 into the absorber layer 3) is typically between 0 atoms/cm$^3$ (undoped) and approx. $10^{18}$ atoms/cm$^3$ for silicon before melting or the recrystallisation step and, after melting or the recrystallisation step, between approx. $10^{17}$ and $10^{22}$ atoms/cm$^3$, preferably between $3 \times 10^{18}$ and $2 \times 10^{21}$ atoms/cm$^3$. The concentration of dopant in the low-doped absorber layer or in the low-doped region of the absorber layer 3 is between 0 atoms/cm$^3$ (undoped) and approx. $10^{17}$ atoms/cm$^3$ before melting or the recrystallisation step. The corresponding concentration after melting or the recrystallisation step are between approx. $10^{14}$ atoms/cm$^3$ and $10^{19}$ atoms/cm$^3$. For solar cells, a dopant concentration (after melting) of $10^{16}$ to $5 \times 10^{17}$ atoms/cm$^3$ is optimal.

If, as described, a capping multilayer system 4 is used, then in the case of the production process according to the invention, separate production of the pn transition or the emitter layer 8 is likewise dispensed with (process step 8 in the state of the art), i.e. the production of the pn transition can likewise be effected in the high temperature step in which production of the BSF layer is effected. After removal of the capping multilayer 4, the metallisation of the solar cell can therefore be begun immediately.

As an alternative hereto, a conventional capping layer 4 can however also be used and the pn transition can be produced analogously to process step 8 of the state of the art (by printing, spraying or depositing a source layer which is enriched with dopant, which is complementary to the doping layer present in the absorber layer 3, with subsequent or simultaneous introduction of this dopant into the active absorber layer 3 by tempering).

Optionally by further recrystallisation of the emitter/absorber layer 3, 8 on the surface which is orientated away from the substrate or on the emitter side, an emitter layer which has a thickness which falls below the thickness of the absorber can be produced with specific adjustment of the thickness of the liquid silicon. Such an emitter layer typically has a thickness in the range of approx. 1 μm.

Essential aspects of the present invention are hence the doping of the base layer or absorber layer in the melting phase by diffusion out of doped layer systems adjacent to the base layer and the recrystallisation of the absorber layer which is effected simultaneously with this doping and production of the BSF layer by diffusion from a source layer. The described processes are thus effected in a single high temperature step.

Control of the doping of the absorber layer can take place by adaptation of the recrystallisation speed and also of the previous and subsequently occurring heating, cooling and tempering processes. Control of the doping of the absorber layer can be effected however also by adaptation of the multilayer systems, i.e. of the capping multilayer system and/or of the intermediate layer multilayer system (with respect to the number and/or type of partial layers used, the dopant content thereof and thickness thereof).

The invention claimed is:

1. Method for the production of a doped semiconductor layer system for electronics or photovoltaics, wherein
   in a first step, a substrate base layer is (1) produced,
   in a second step, on this substrate base layer (1) an intermediate layer system (2) comprising at least one partial layer is deposited, at least one of the partial layers of the intermediate layer system (2) being enriched with a first dopant in a first concentration,
   in a third step, an absorber layer (3) which is doped with a second dopant in a second concentration is deposited on the intermediate layer system (2),
   in a recrystallisation step, the absorber layer (3) is heated and brought to melt and is cooled subsequently in order to solidify, the recrystallisation step is controlled such or in that it is heated, cooled and tempered such that the first dopant diffuses out of the intermediate layer system (2) into the absorber layer (3), while the latter is molten and/or while the latter is resolidifying and/or while the latter has solidified.

2. The method according to claim 1,
   characterised in that,
   after the third step and before the recrystallisation step, an undoped capping layer (4) is applied on the absorber layer (3) and in that this capping layer (4) is removed again after the recrystallisation step.

3. The method according to claim 2, characterised in that the capping layer (4) or the capping layer system (4) is produced by deposition or by thermal oxidation.

4. The method according to claim 1, characterised in that, after the third step and before the recrystallisation step, a capping layer system (4) comprising at least one partial layer is applied on the absorber layer (3), at least one of the partial layers of the capping layer system (4) being enriched with a third dopant in the third concentration.

5. The method according to claim 4, characterised in that this capping layer system (4) is removed again after the recrystallisation step.

6. The method according to one of claim 4 or 5, characterised in that, on the side of the semiconductor system orientated away from the substrate, a pn transition or an emitter layer is produced, in that the recrystallisation step is controlled such or in that it is heated, cooled and tempered such that the third dopant is diffused out of the capping layer system (4) into the absorber layer (3) while the latter is molten and/or while the latter is resolidifying and/or while the latter has solidified.

7. The method according to claim 6, characterised in that the quantity of the inward diffused third dopant is controlled with the help of partial layers of the capping layer system (4) which are situated on the side orientated towards the absorber layer (3) and are undoped or weakly doped.

8. The method according to claim 7, characterised in that control takes place via the temperature and/or tempering time or by the temperature profile over time.

9. The method according to claim 6, characterised in that an emitter contact is applied on the emitter layer.

10. The method according to claim 4, characterised in that the quantity of the third and/or the quantity of the first dopant which diffuses into the absorber layer (3) while the latter is solidifying and/or has solidified is adjusted by segregation processes.

11. The method according to claim 10, characterised in that the adjustment is effected over a temperature gradient in the absorber layer (3) and/or in the capping layer system (4) and/or between the absorber layer (3) and the capping layer system (4).

12. The method according to claim 4, characterised in that the third dopant is complementary to the second dopant or in that the third dopant is not complementary to the second dopant.

13. The method according to claim 4, characterised in that the second and the third dopant are identical.

14. The method according to claim 4, characterised in that the second dopant is complementary to the first and third dopant or in that the first dopant is complementary to the second and third dopant or in that the third dopant is complementary to the first and second dopant.

15. The method according to claim 4, characterised in that the layer thickness at least of one partial layer of the capping layer system (4) is above 10 nm and/or below 10000 nm, in particular above 100 m and/or below 1000 nm and/or in that the capping layer system contains or comprises compounds of Si, O, C, N, B, P, Al, Ga, Sb, As and/or In, in particular $SiO_2$, $SiN_x$, SiC, BC and/or BN.

16. The method according to one of the preceding claims and according to one of the claims 1 or 4, characterised in that control takes place via the heating capacity and/or the distribution of the heating capacity and/or the feed rate and/or at least one heating ramp and/or at least one cooling ramp and/or the temperature of a tempering plateau and/or via a tempering time.

17. The method according to claim 4, characterised in that the doping of the absorber layer (3) is controlled via the number, the thickness and/or the dopant content of the individual layers of the capping layer system (4) and/or of the intermediate layer system (2).

18. The method according to claim 4, characterised in that the first and the second dopant cause an n conductivity ($n^+$np system) and in that the third dopant causes a p conductivity or in that vice versa the first and the second dopant cause a p conductivity and in that the third dopant causes an n conductivity ($p^+$pn system) or in that the first and the third dopant cause an n conductivity and in that the second dopant causes a p conductivity (npn system) or vice versa (pnp system) or in that the second and the third dopant cause an n conductivity and in that the first dopant causes a p conductivity ($pnn^+$ system) or vice versa ($npp^+$ system).

19. Method for the production of a doped semiconductor layer system for electronics or photovoltaics, wherein
in a first step, a substrate base layer is (1) produced,
in a second step, on this substrate base layer (1) an intermediate layer system (2) comprising at least one partial layer is deposited, at least one of the partial layers of the intermediate layer system (2) being enriched with a first dopant in a first concentration,
in a third step, an absorber layer (3) which is doped with a second dopant in a second concentration is deposited on the intermediate layer system (2),
in a recrystallisation step, the absorber layer (3) is heated and brought to melt and is cooled subsequently in order to solidify so that on the side of the semiconductor system or of the absorber layer (3) which is orientated away from the substrate or towards the substrate, a pn transition or an emitter layer is produced in that a third dopant which is complementary to the first and second dopant is introduced into the absorber layer (3).

20. The method according to either of claims 1 or 19, characterised in that the second dopant is complementary to the first dopant or in that the second dopant is not complementary to the first dopant.

21. The method according to either of claims 1 or 19, characterised in that the first and the second dopant are identical.

22. The method according to either of claims 1 or 19, characterised in that the absorber layer (3) is doped complementarily to the intermediate layer system (2) such that the complementary doping is over-doped in the recrystallisation step.

23. The method according to either of claims 1 or 19, characterised in that
the layer thickness at least of one partial layer of the intermediate layer system (2) is above 10 nm and/or below 10000 nm, in particular above 100 nm and/or below 1000 nm and/or in that the intermediate layer system contains or comprises compounds of Si, O, C, N, B, P, Al, Ga, Sb, As and/or In, in particular $SiO_2$, $SiN_x$, SiC, BC and/or BN and/or in that the intermediate layer system (2) is conductive.

24. The method according to either of claims 1 or 19, characterised in that
tempering takes place in the recrystallisation step.

25. The method according to claim 19, characterised in that
the pn transition or the emitter layer is produced in that a source layer enriched with the third dopant is applied to the absorber layer (3), printed on, sprayed on or deposited on the absorber layer (3) and subsequently or simultaneously the third dopant is introduced into the absorber layer (3 by tempering.

26. The method according to either of claims 1 or 19, characterised in that
the second concentration is chosen such that it is the same or lower than the dopant concentration to be achieved in the absorber layer (3) after conclusion of the production method.

27. The method according to either of claims 1 or 19, characterised in that
the doping of the absorber layer (3) is controlled via the recrystallisation speed and/or recrystallisation temperature.

28. The method according to claim 19, characterised in that
the concentration of the third dopant in the absorber layer (3) before the recrystallisation step or the melting is above 0 atoms/$cm^3$ and/or below $10^{18}$ atoms/$cm^3$ and/or in that this concentration after the recrystallisation step or the melting is above $10^{16}$ atoms/$cm^3$ and/or below $10^{23}$ atoms/$cm^3$, in particular above $3\cdot10^{18}$ and/or below $2\cdot10^{21}$ atoms/$cm^3$.

29. Method for the production of a doped semiconductor layer system for electronics or photovoltaics, wherein
in a first step, a substrate base layer is (1) produced,
in a second step, on this substrate base layer (1) an intermediate layer system (2) comprising at least one partial layer is deposited, at least one of the partial layers of the intermediate layer system (2) being enriched with a first dopant in a first concentration,
in a third step, an absorber layer (3) which is doped with a second dopant in a second concentration is deposited on the intermediate layer system (2),
in a recrystallisation step, the absorber layer (3) is heated and brought to melt and is cooled subsequently in order to solidify so that in a part of the absorber layer (3) which is orientated towards the substrate base (1), a layer with a higher concentration of dopant than in the remaining absorber layer (3), in particular a BSF layer (back surface field), is formed in that the recrystallisation step is controlled such or in that heating cooling and tempering take place such that the first dopant diffuses out of the intermediate layer system (2) into the absorber layer (3) while the latter is molten and/or while the latter is resolidifying and/or while the latter has solidified.

30. The method according to claim 1 or claim 19 or claim 29,
characterised in that,
as a result of an additional recrystallisation step, the absorber layer (3) is melted on the side thereof orientated away from the substrate in a defined thick region.

31. The method according to one of claims 1 or 29, characterised in that
the molten thick region is less than the thickness of the absorber layer (3) and/or in that an emitter layer is produced in particular with a thickness of above 0.1 μm and/or below 10 μm.

32. The method according to claim 1 or claim 19 or claim 29,
characterised in that
the concentration of the first dopant in the intermediate layer system (2) before the recrystallisation step or the melting is above 0 atoms/$cm^3$ and/or below $10^{23}$ atoms/$cm^3$ and/or in that this concentration after the recrystallisation step or the melting is above $10^{16}$ atoms/$cm^3$.

33. The method according to claim 1 or claim 19 or claim 29,
characterised in that
the concentration of the second dopant in the absorber layer (3) before the recrystallisation step or the melting is above 0 atoms/$cm^3$ and/or below $10^{17}$ atoms/$cm^3$ and/or in that this concentration after the recrystallisation step or the melting is above $10^{14}$ atoms/$cm^3$ and/or below $10^{19}$ atoms/$cm^3$, in particular above $10^{16}$ atoms/$cm^3$ and/or below $5\cdot10^{17}$ atoms/$cm^3$.

34. The method according to claim 1 or claim 19 or claim 29,
characterised in that
a metallic contact layer or a metallisation is applied on the substrate base layer (1) and/or on the absorber layer (3).

35. The method according to claim 1 or claim 19 or claim 29,
characterised in that
the substrate base layer (1) and/or the absorber layer (3) contains silicon (Si) and/or is conductive.

36. The method according to claim 1 or claim 19 or claim 29 in the field of the production of electronic components, in particular in silicon-on-insulator technology, or for the production of or in the field of thin layer solar cells, in particular crystalline silicon thin layer solar cells.

* * * * *